United States Patent [19]

Cresswell et al.

[11] 3,881,964

[45] May 6, 1975

[54] ANNEALING TO CONTROL GATE SENSITIVITY OF GATED SEMICONDUCTOR DEVICES

[75] Inventors: Michael W. Cresswell; Richard J. Fiedor, both of Pittsburgh, Pa.

[73] Assignee: Westinghouse Electric Corporation, Pittsburgh, Pa.

[22] Filed: Mar. 5, 1973

[21] Appl. No.: 337,967

[52] U.S. Cl. .................... 148/1.5; 148/175; 357/38

[51] Int. Cl. .................... H01l 7/54

[58] Field of Search .................... 148/1.5; 317/235

[56] References Cited

UNITED STATES PATENTS

| | | | |
|---|---|---|---|
| 2,911,533 | 11/1959 | Damask | 148/1.5 X |
| 3,272,661 | 9/1966 | Tomono et al. | 148/1.5 |
| 3,533,857 | 10/1970 | Mayer et al. | 148/1.5 |
| 3,607,449 | 9/1971 | Tokuyama et al. | 148/1.5 |
| 3,725,148 | 4/1973 | Kendall | 148/1.5 X |

OTHER PUBLICATIONS

Clark et al., "Isochronal Annealing of p–and n–type Silicon Irradiated at 80°K," *Phil. Mag.* 20, (167), November, 1969, pp. 951,958.

*Primary Examiner*—L. Dewayne Rutledge
*Assistant Examiner*—J. M. Davis
*Attorney, Agent, or Firm*—C. L. Menzemer

[57] ABSTRACT

The gate sensitivity of a gated semiconductor device such as a thyristor or transistor is decreased with precision without significantly changing certain other electrical characteristics of the device. Conducting portions of the device are first masked against irradiation and then gating portions of the device are selectively irradiated to a high level with a suitable radiation such as electron radiation to greatly increase the gate current to fire ($I_g$). The device is then indiscriminately or selectively annealed, preferably while monitoring the gate current, to reduce the gate current to fire ($I_g$) to a desired value.

9 Claims, 6 Drawing Figures

ANNEALING TO CONTROL GATE SENSITIVITY OF GATED SEMICONDUCTOR DEVICES

FIELD OF THE INVENTION

The present invention relates to the manufacture of semiconductor devices and particularly high power gated semiconductor devices.

BACKGROUND OF THE INVENTION

In making gated semiconductor devices, many units fail to meet the specifications for which they were designed because of excessive gate sensitivity. For example, certain thyristors are rejected as too trigger sensitive if maximum gate current to fire does not exceed 10 milliamps. Other devices cannot be designed with certain gate sensitivities because of the need also for low forward voltage drop.

The gate sensitivity of a semiconductor device is by definition inversely dependent on the gate current needed to fire or drive the device. Gate current is in turn a function of the injection efficiency ($\gamma$) into a base region and the carrier lifetime ($\tau$) in said base region of the device. Both of these parameters are affected by the impurity concentration ($N_A$) in the base region. Thus, the gate current can be decreased and gate sensitivity increased by decreasing the base impurity concentration. Conversely, increasing the base impurity concentration to decrease gate sensitivity increases the forward voltage drop. Design of a gated semiconductor device has therefore routinely involved a trade-off between gate current and forward voltage drop requirements.

Moreover, rejection of gated devices after manufacture because of excessive gate sensitivity, i.e., too low gate current to drive or trigger, has been a problem in the making of semiconductor devices. Sometimes devices with too low triggering current can be reclaimed by sandblasting. But the degree and range of control of gate current by sandblasting is limited. Greater precision and wider flexibility in raising the gate current are needed to provide better quantitative yields in semiconductor device manufacture.

It has become known to irradiate semiconductor devices for various reasons. Specifically, it is described in copending application Ser. No. 283,685, filed Aug. 25, 1972, and assigned to the same assignee as the present invention, inter alia, to selectively irradiate gating portions of a gated semiconductor device to increase gate current to fire or drive. However, the actual increase in gate current for a given radiation dosage has been found to be erratic; and the continuous monitoring of gate current during irradiation is difficult and hazardous. In addition, specifications are prescribing devices with gate currents within narrow ranges which do not conform to standard electrical characteristic ranges.

The present invention overcomes these specific difficulties. It provides a technique to obtain a device with a well-defined gate current to drive or trigger which is greater than the triggering current typically available by standard manufacturing techniques. It also provides for the reclaim of devices which are rejected because their gate sensitivity is too high.

SUMMARY OF THE INVENTION

A method is provided for controllably decreasing the gate sensitivity of a gated semiconductor device, such as a thyristor or transistor, without significantly affecting the other electrical characteristics and particularly the forward voltage drop of the device. The gated semiconductor device has conducting portions thereof masked against radiation, and thereafter gating portions of the device are irradiated with a suitable radiation source through the mask. The irradiation is carried to a dosage which reduces the gate sensitivity below a desired level. The gate sensitivity is subsequently returned to the desired level by bulk or selective annealing of the semiconductor device, preferably while monitoring the gate current of the device.

Electron radiation is preferably used as a suitable radiation source because of availability and inexpensiveness. However, it is contemplated that any kind of radiation such as proton, neutron, alpha and gamma radiation may be appropriate, provided it is capable of bombarding and disturbing the atomic lattice to create energy levels that substantially increase the recombination rate of the carriers without correspondingly increasing the carrier generation rate.

In addition, the electron radiation with an intensity greater than 1 Mev is preferably carried to a dosage level between $1 \times 10^{13}$ electrons/cm$^2$ and $1 \times 10^{15}$ electrons/cm$^2$ and most desirably between $1 \times 10^{14}$ and $5 \times 10^{14}$ electrons/cm$^2$. It has been found that dosage levels within this range with a 2 Mev electron beam insures desensitization of the gating portions without causing too severe damage to the lattice structure.

The annealing is preferably done in an inert atmosphere at a temperature ranging between about 275° and 400°C. The time and temperature are inversely proportional. Preferably the annealing is continued for between about 15 and 150 minutes at a temperature between about 300° and 350°C. Higher temperatures may be more preferable if selective annealing of the irradiated gating portions is used. With such selective annealing, decomposition of passivating compositions is not encountered in the annealing operation. As a result, the annealing step can be accomplished in a shorter time period with the selective anneal. Further, the gate current can be monitored without interrupting the annealing step.

Other details, objects and advantages of the invention will become apparent as the following description of the present preferred embodiments and present preferred methods of practicing the same proceeds.

BRIEF DESCRIPTION OF THE DRAWINGS

In the accompanying drawings, the present preferred embodiments of the invention and present preferred methods of practicing the invention are illustrated in which.

DESCRIPTION OF THE PREFERRED EMBODIMENTS

Figure 1:
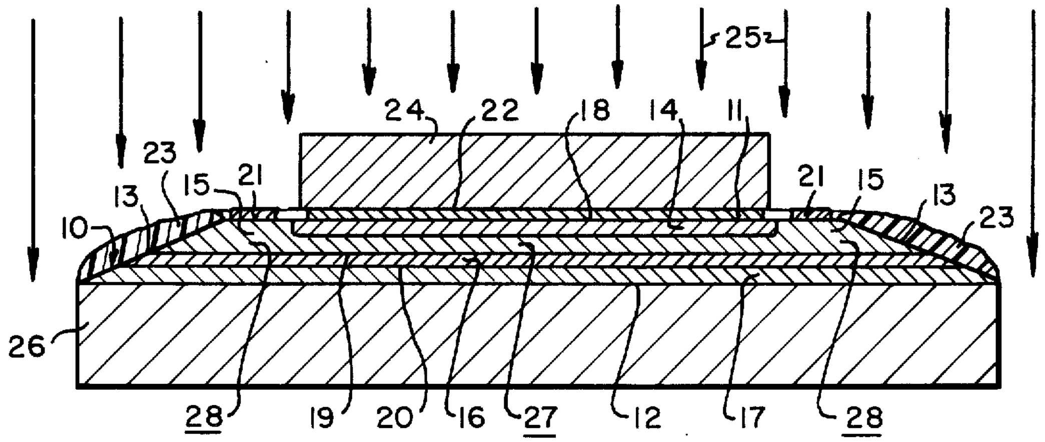
FIG. 1 is an elevational view in cross-section of an edge fired thyristor having gating portions selectively irradiated in accordance with the present invention.

Referring to FIG. 1, an edge fired silicon thyristor wafer or body 10 is shown having opposed major surfaces 11 and 12 and curvilinear side surfaces 13. The thyristor wafer 10 has cathode-emitter region 14 and anode-emitter region 17 of impurities of opposed conductivity type adjoining the major surfaces 11 and 12, respectively. Cathode-base region 15 and anode-base region 16 of impurities of opposite conductivity type are provided in the interior of the wafer between emitter regions 14 and 17. The cathode-emitter region 14 and cathode-base region 15 are also of impurities of opposite conductivity type, as are anode-base region 16 and anode-emitter region 17. By this arrangement, thyristor wafer 10 is provided with a four layer impurity structure in which three PN junctions 18, 19 and 20 are provided.

The thyristor is provided with an edge fired gate by adjoining cathode-base region 15 to the major surface 11 at outward portions thereof. Surface portions of cathode-base region 15 thus extend annularly around cathode-emitter region 14 to define the entirety of conducting portions 27 in the central part of the device. The entirety of the gating portions 28 of the device are co-extensive with the portions of the cathode-base region 15 adjoining major surface 11 at the peripheral part of the device.

To provide electrical connections to the thyristor, metal contacts 21 and 22 make ohmic contact to cathode-base region 15 and cathode-emitter region 14, respectively, at major surface 11, while metal substrate 26 makes ohmic contact to anode-emitter region 17 at major surface 12. Atmospheric effects on the thyristor operation are substantially reduced by coating side surfaces 13 with a suitable passivating resin 23 such as a silicone, epoxy or varnish composition.

Selective irradiation is performed on thyristor wafer 10 by masking conducting portions 27 of wafer 10 with a circular shield plate 24 and annularly irradiating gating portions 28 of wafer 10 with suitable radiation 25. Shield plate 24 is mechanically positioned in contact with metal contact 22 to mask conducting portions 27 against radiation. Plate 24 is of any material of sufficient density and thickness to be opaque to the particular radiation used. For electron radiation, shield plate 24 may be standard, low carbon steel about ¼-inch thickness or tungsten or lead of about 5/32-inch thickness. After the radiation is completed, shield plate 24 is physically removed for reuse in subsequent irradiations.

Figure 2:
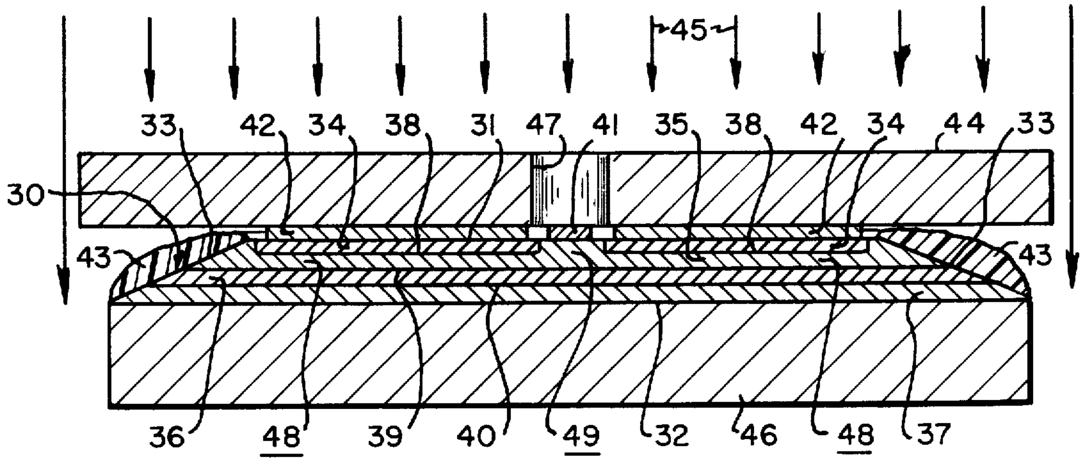
FIG. 2 is an elevational view in cross-section of a center fired thyristor having gating portions selectively irradiated in accordance with the present invention.

Referring to FIG. 2, center fired silicon thyristor wafer or body 30 is shown having opposed major surfaces 31 and 32 and curvilinear side surfaces 33. The thyristor wafer 30 has cathode-emitter region 34 and anode-emitter region 37 of impurities of opposite conductivity type adjoining major surfaces 31 and 32, respectively. Cathode-base region 35 and anode-base region 36 of impurities of opposite conductivity type are provided in the interior of the wafer between emitter regions 34 and 37. Cathode-emitter region 34 and cathode-base region 35 are also of opposite conductivity type of impurities, as are anode-base region 36 and anode-emitter region 37. By this arrangement, thyristor wafer 30 is provided with a four layer impurity structure in which three PN junctions 38, 39 and 40 are provided.

The thyristor is provided with a center fired gate by adjoining cathode-base region 35 to the major surface 31 at center portions thereof. Cathode-emitter region 34 thus extends annularly around surface portions of region 35 to define the entirety of gating portions 49 at the central part of the device. The conducting portions 48 of the device are co-extensive with the cathode-emitter region 34 of the peripheral part of the device.

To provide electrical connection to the thyristor wafer, metal contacts 41 and 42 make ohmic contact to cathode-emitter region 34 and cathode-base region 35, respectively, at major surface 31, while metal substrate 46 makes ohmic contact to anode-emitter region 37 at major surface 32. Atmospheric effects on the thyristor operation are substantially reduced by coating side surfaces 33 with a suitable passivating resin 43 such as a silicone, epoxy or varnish composition.

Selective irradiation is performed on wafer 30 by masking conducting portions 48 of wafer 30 with annular shield plate 44 having a circular center opening 47 therein, and irradiating gating portions 49 of wafer 30 with suitable radiation 45 through opening 47. Shield plate 44 is positioned by mechanically placing it in contact with metal contact 42 to mask conducting portions 48 against radiation while leaving gating portions 49 exposed. Plate 44 is of the same density and thickness as previously described for shield plate 24. After the radiation is completed, plate 44 is physically removed for reuse in subsequent irradiations.

Figure 3:
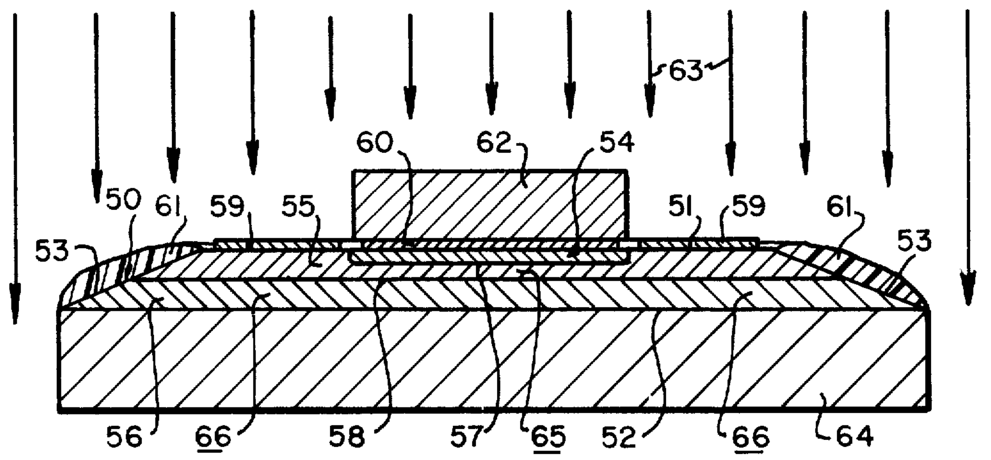
FIG. 3 is an elevational view in cross-section of an edge driven transistor having gating portions selectively irradiated in accordance with the present invention.

Referring to FIG. 3, an edge driven silicon transistor wafer or body 50 is shown having opposed major surfaces 51 and 52 and curvilinear side surfaces 53. The transistor wafer 50 has emitter and collector regions 54 and 56 of impurities of one conductivity type adjoining major surfaces 51 and 52, respectively, and base region 55 of impurities of the opposite conductivity type in the interior of the wafer 50 between emitter and collector regions 54 and 56. Two PN junctions 57 and 58 are thus present, junction 57 at the transition between regions 54 and 55 and junction 58 at the transition between regions 55 and 56.

The transistor is provided with an edge driven gate by adjoining base region 55 to major surface 51 at outward portions thereof. Surface portions of base region 55 thus extend around emitter region 54 to define the entirety of the conducting portions 65 at the central part of the device. The entirety of gating portions 66 of the device are co-extensive with the portion of base region 55 adjoining major surface 51 at the periphery of the device.

To complete the transistor, metal contacts 59 and 60 make ohmic contacts to emitter and base regions 54 and 55, respectively, at major surface 51, while metal substrate 64 makes ohmic contact to collector 56 at major surface 52. Atmospheric effects on transistor operation are substantially reduced by coating side surfaces 53 with a suitable passivating resin 61 such as a silicone, epoxy or varnish composition.

Selective radiation is performed on wafer 50 by masking conducting portions 65 of wafer 50 with circular shield plate 62 and annularly irradiating gating portions 66 of wafer 50 with suitable radiation 63. Plate 62 is of the same density and thickness as previously described for shield plate 24. Shield plate 62 is simply mechanically positioned in contact with metal contact 60 to mask conducting portions 65 against radiation while leaving gating portions 66 exposed. After irradiation is completed, shield plate 62 is physically removed for reuse in subsequent irradiations.

Figure 4:
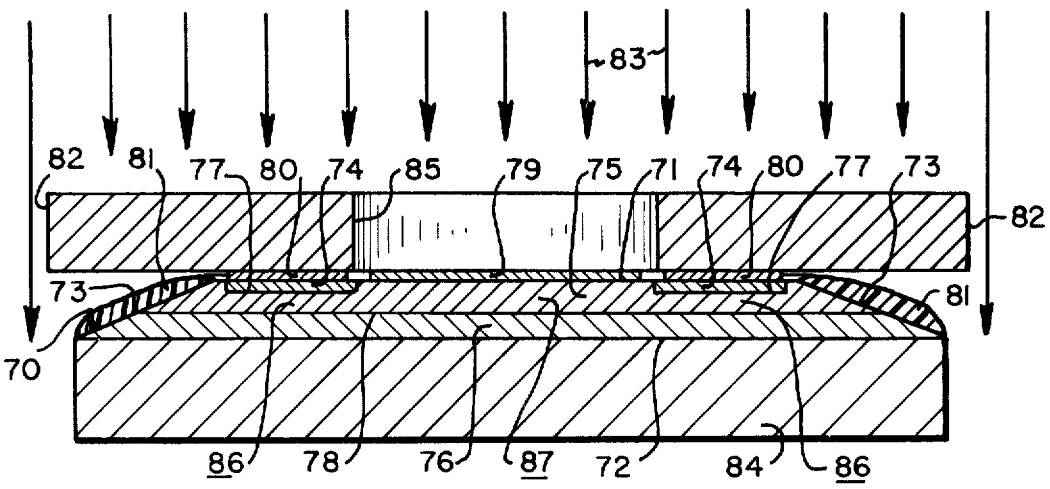
FIG. 4 is an elevational view in cross-section of a center driven transistor having gating portions selectively irradiated in accordance with the present invention.

Referring to FIG. 4, center driven silicon transistor wafer or body 70 is shown having opposed major surfaces 71 and 72 and curvilinear side surfaces 73. The transistor wafer 70 has emitter and collector regions 74 and 76 of impurities of one conductivity type adjoining major surfaces 71 and 72, respectively, and base regions 75 of impurities of the opposite conductivity type in the interior of the wafer 70 between emitter and collector regions 74 and 76. By this arrangement, transistor wafer 70 is provided with a three layer impurity structure in which two PN junctions 77 and 78 are provided.

The transistor is center driven by adjoining base region 75 to the major surface 71 at center portions thereof. Emitter region 74 thus extends around surface portions of the base region 75 to define the entirety of gating portions 87 at the central part of the device. The entirety of the conducting portions 86 are coextensive with emitter regions 74 adjoining major surface 71 at the peripheral part of the device.

To provide electrical connection to the transistor wafer, metal contacts 79 and 80 make ohmic contact to base region 75 and emitter region 74, respectively, at major surface 71, while metal substrate 84 makes ohmic contact to collector region 76 at major surface 72. Atmospheric effects on the transistor operation are reduced by coating side surfaces 73 with a suitable passivating resin 81 such as a silicone, epoxy or varnish composition.

Selective radiation is performed on wafer 70 by masking conducting portions 86 of wafer 70 with an annular shield plate 82 having circular opening 85 therein, and irradiating gating portions 87 of wafer 70 with suitable radiation 83 through opening 85. Shield plate 82 is mechanically positioned in contact with metal contact 79 to mask conducting portions 86 against radiation while leaving gating portions 87 exposed. Plate 82 is of the same density and thickness as previously described for shield plate 24. After irradiation is completed, shield plate 82 is physically removed for reuse in subsequent irradiations.

Whether edge fired or center fired, thyristor or transistor, a suitable radiation for the radiation source in this step of the invention is preferably electron radiation because of availability and inexpensiveness. Moreover, electron radiation (or gamma radiation) may be preferred in some applications where the damage desired in the semiconductor lattice is to single atoms and small groups of atoms. This is in contrast to neutron and proton radiation which causes large disordered regions of as many as a few hundred atoms in the semiconductor crystal. The latter type radiation source may, however, be preferred in certain applications because of its better defined range and better controlled depth of lattice damage. It is anticipated that any kind of radiation may be appropriate provided it is capable of bombarding and disrupting the atomic lattice to create energy levels substantially decreasing carrier lifetimes without correspondingly increasing the carrier generation rate.

Electron radiation is also preferred over gamma radiation because of its availability to provide adequate dosages in a commercially practical time. For example, a $1 \times 10^{12}$ electrons/cm$^2$ dosage of 2 Mev electron radiation will result in approximately the same lattice damage as that produced by a $1 \times 10^6$ rads dosage of gamma radiation; and a $1 \times 10^{14}$ electrons/cm$^2$ dosage of 2 Mev electron radiation would result in approximately the same lattice damage as that produced by a $1 \times 10^8$ rads dosage of gamma radiation. Such dosages of gamma radiation, however, would entail several weeks of irradiation, while such dosages can be supplied by electron radiation in minutes.

Further, it is preferred that the radiation level of electron radiation be greater than 1 Mev and most desirably greater than 2 Mev. Lower level radiation is generally believed to result in substantial elastic collisions with the atomic lattice and, therefore, does not provide enough damage to the lattice in commercially feasible times.

To provide appropriate radiation, it has been found that radiation dosages above $1 \times 10^{13}$ electrons/cm$^2$ are preferred and that radiation dosages above $3 \times 10^{13}$ electrons/cm$^2$ are further desired. Lower dosage levels have not been generally found to sufficiently reduce the sensitivity of the gate portions. Conversely, it is preferred that the radiation dosage does not exceed about $1 \times 10^{15}$ electrons/cm$^2$ so that the physical damage to the gate portions does not become too severe. Preferably, a dosage of between $3 \times 10^{13}$ and $1 \times 10^{15}$ electrons/cm$^2$ and most desirably between $1 \times 10^{14}$ and $5 \times 10^{14}$ electrons/cm$^2$ will desensitize the gate sufficiently for purposes of the invention.

In any case, the suitable radiation is carried to a dosage sufficient to decrease the gate sensitivity below the desired value. The precise radiation dosage may also depend on the portions of the semiconductor device shielded and irradiated. Preferably, as shown in FIGS. 1–4, substantially all conducting portions of the device are masked and substantially all gating portions of the device are irradiated. However, masking of only a part of the conducting portions and, conversely, irradiating only a part of the gating portions is consistent with the operation of the present invention, see, e.g., application Ser. No. 343,070, filed Mar. 20, 1973 and assigned to the same assignee as the present invention.

After selective irradiation of gating portions, the gated semiconductor device, whether it be a thyristor or transistor, is annealed to return the gate sensitivity to the desired value. The anneal may be done by simply placing the device in an inert atmosphere in a standard induction furnace or the like and heating at a suitable temperature for a suitable time. It should be noted in this connection that the time and temperature of the anneal are inversely proportional. Thus, if higher temperatures are used, shorter time is required to perform the anneal. However, the temperature must be kept low, e.g., below about 400°C, to avoid damage to the crystal structure and dislocation of the impurity regions.

In any event, it is preferred that during the annealing the gate current is monitored. This can be done by periodically removing the semiconductor device from the annealing furnace and measuring the gate current to fire in accordance with JEDEC Standard 6.201.1.8.

Figure 5:
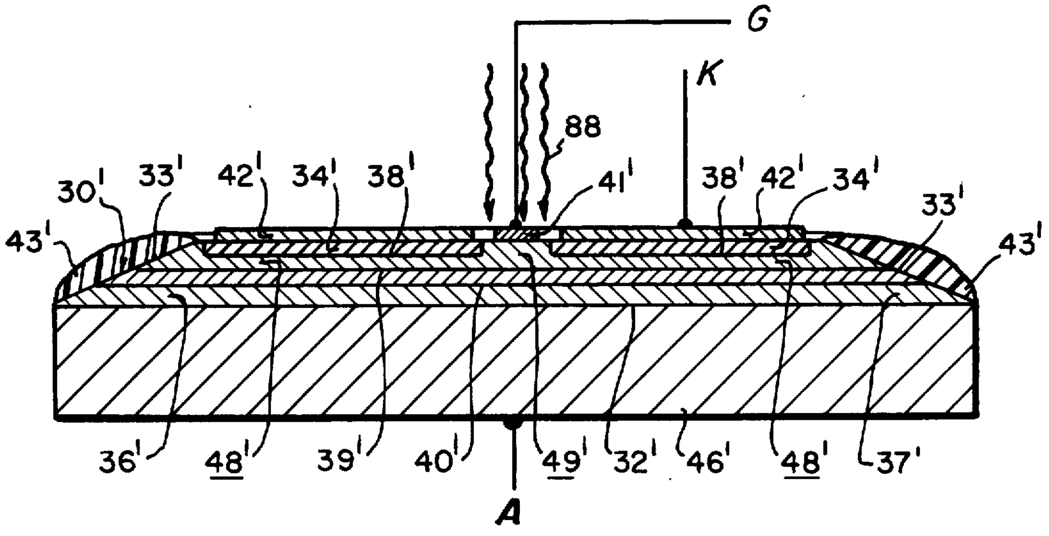
FIG. 5 is an elevational view in cross-section of a center fired thyristor similar to that shown in FIG. 2 having gating portions selectively annealed, while the gate current is measured, in accordance with the present invention.

Referring to FIG. 5, it is preferred that the irradiated gate portions be selectively annealed. This permits more rapid annealing as well as monitoring of the gate current ($I_g$) without interruption of the anneal. FIG. 5 shows the selective anneal with a center fired thyristor as shown in FIG. 2; however, the selective anneal would apply in similar fashion to an edge fired thyristor or a center or edge fired transistor.

The selective anneal can be done by simply directing a laser beam or some other suitable radiation source onto the surfaces of the irradiated portions of the device to selectively heat those parts of the thyristor by radiation 88. At the same time, point probes G and K similar to those used to measure spreading resistance are placed in contact with metal contacts 41' and 42', respectively, while contact A is placed in contact with contact 46'. By following JEDEC Standard 6.201.1.8 the gate current to trigger can thus be periodically read without interrupting the anneal step.

Figure 6:
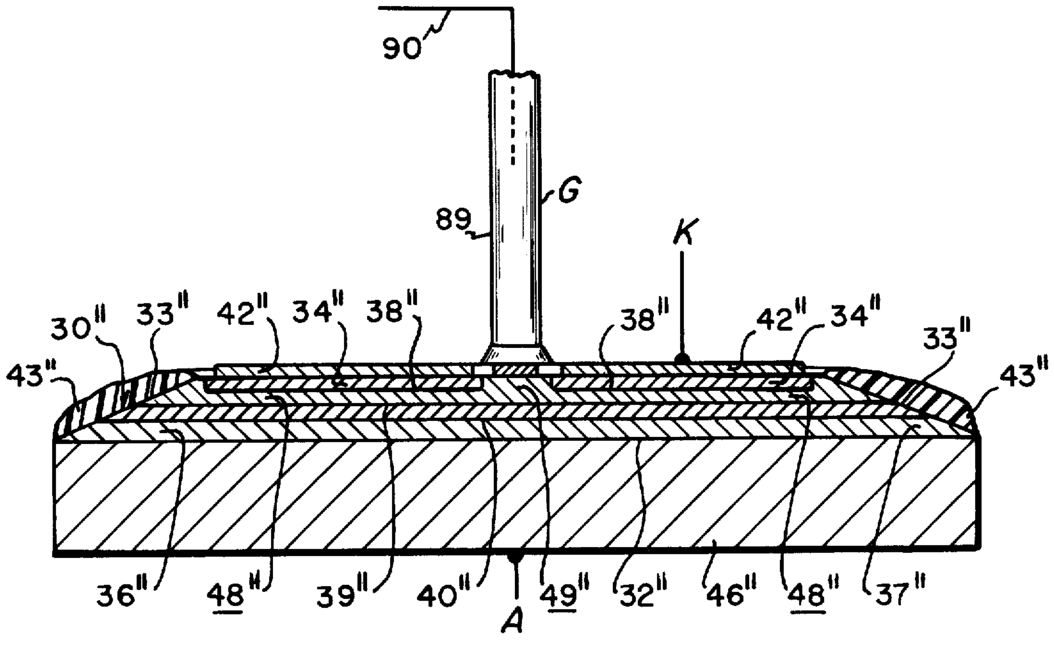
FIG. 6 is an elevational view in cross-section of a center fired thyristor similar to that shown in FIG. 2 having gating portions selectively annealed, while the gate current is measured, in accordance with the present invention.

Referring to FIG. 6, an alternative technique is shown for selectively annealing the irradiated gating portions 49'' while continuously measuring the gate current to fire the gated device. An induction heater 89 such as a blunt-end soldering iron is placed in contact with the irradiated gating portions 49'' and heated by a power source through lead 90. The gating portions 49 are thus heated by conduction from the heater 89. The gate current can be simultaneously measured by providing contact G to the heater 89, while contacts K and A are attached as described in connection with FIG. 5. The gate current can again be measured by following JEDEC Standard 6.201.1.8 because the heater 89 makes both electrical and thermal connection with gating portions 49''.

The main advantage of selective annealing is that high temperatures and in turn shorter annealing times can be achieved. For example, if passivating coating 43' is a varnish composition, a bulk anneal must be performed below about 200°C to avoid carbonization of the coating. While with a selective anneal, higher temperatures can be used because the coating is not subjected to annealing temperature. In addition, selective anneal permits the measurement of the gate current ($I_g$) without interrupting the anneal.

To illustrate the invention, 27 commercially available 1,800 volt, center fired thyristors were selectively irradiated and subsequently incrementally annealed. The first 14 thyristors were also incrementally and selectively irradiated. The gate current to fire ($I_g$) was measured at each increment of the irradiation and anneal. The results of the measurements are shown in Tables I and II below.

The thyristors used for these tests were similar to that shown in FIG. 2, and were nominally 1.3 inches in diameter. The device had cathode emitters which, because of the beveled curvilinear side surfaces, were about 1.06 inches in outside diameter. The inside diameter of the cathode emitter region (and outside diameter of the entirety of the gating portions) of the devices were nominally 0.15 inch in diameter. The irradiation shield plate was a steel washer having a 2.0 inch outside diameter and an 0.25 inch inside diameter. The radiation source was a 2 Mev electron beam.

TABLE I

| Device No. | Radiation Dosage (e/cm$^2$) | | | | Anneal Time at 325°C (minutes) | | |
|---|---|---|---|---|---|---|---|
| | 0 | 3×10$^{13}$ | 6.2×10$^{13}$ | 9.2×10$^{13}$ | 10 | 70 | 130 |
| 1 | 104[1] | 124 | 152 | 185 | 174 | 152 | 136 |
| 2 | 82 | 107 | 135 | 614 | 391 | 275 | 184 |
| 3 | 82 | 119 | 243 | 528 | 348 | 291 | 221 |
| 4 | 147 | 178 | 221 | 935 | 967 | 725 | 670 |
| 5 | 158 | 178 | 200 | 1087 | 745 | 535 | 179 |
| 6 | 973 | 927 | 955 | 938 | 347 | 1021[2] | 1062[2] |
| 7 | 77 | 775 | 124 | 422 | 147 | 125 | 115 |
| 8 | 28 | 37 | 42 | 49 | 49 | 49 | 44 |
| 9 | 65 | 80 | 151 | 1033 | 914 | 157 | 104 |
| 10 | 103 | 135 | 157 | 651 | 466 | 275 | 142 |
| 11 | 60 | 69 | 238 | 1057 | 756 | 492 | 227 |
| 12 | 49 | 58 | 69 | 82 | 82 | 71 | 66 |
| 13 | 71 | 80 | 97 | 363 | 354 | 82 | 72 |
| 14 | 104 | 313 | 475 | 691 | 599 | 344 | 200 |

[1] $I_g$ measured in milliamps.
[2] This is considered an artifact reading.

TABLE II

| Device No. | Radiation Dosage (e/cm$^2$) | | Anneal Time at 325°C (min.) | | | | |
|---|---|---|---|---|---|---|---|
| | Initial | 1.2×10$^{14}$ | 15 | 25 | 55 | 115 | 175 |
| 15 | 93[1] | 374 | 162 | 185[2] | 137 | 114 | 104 |
| 16 | 72 | 275 | 227 | 337[2] | 164 | 71 | 72 |
| 17 | 110 | 275 | 189 | 109 | 147 | 136 | 115 |
| 18 | 82 | 341 | 265 | 265 | 169 | 108 | 93 |
| 19 | 44 | 485 | 91 | 179[2] | 65 | 55 | 50 |
| 20 | 82 | 395 | 318 | 238 | 398[2] | 98 | 72 |
| 21 | 93 | 949 | 433 | 496 | 766[2] | 286 | 109 |
| 22 | 93 | 495 | 308 | 427 | 315 | 114 | 93 |
| 23 | 87 | 146 | 125 | 131 | 104 | 92 | 88 |
| 24 | 82 | 318 | 265 | 347 | 223 | 92 | 72 |
| 25 | 136 | 464 | 326 | 331 | 250 | 157 | 137 |
| 26 | 103 | 379 | 347 | 443 | 282 | 103 | 88 |
| 27 | 98 | 581 | 385 | 400 | 282 | 157 | 109 |

[1] $I_g$ measured in milliamps.
[2] This is considered an artifact reading.

As can be seen from Tables I and II, the gate sensitivity is recovered readily and controllably with the anneal subsequent to selective irradiation which desensitized the gate. It should also be noted that similar thyristors Nos. 27 through 36, which were not irradiated or annealed, had their $I_g$ measured along with the devices Nos. 1 to 27 at each stage of the radiation and subsequent anneal. These were for control and established that reasonably consistent current measuring was maintained.

Similarly, the operation of the invention was demonstrated with six (6) 1,600 volt, center fired thyristors. The thyristors were nominally 1.3 inches in diameter, with a cathode emitter having an outside diameter of about 1.06 inches. The cathode-emitter region has an inside diameter of 0.15 inch. The radiation shield was again a steel washer having an outside diameter of 2.0 inches and an inside diameter of 0.25 inch. Again the radiation source was a 2 Mev electron beam and the gate current was measured incrementally in milliamps. The data collected is set forth in Table III below.

TABLE III

| Device No. | Radiation Dosage (e/cm²) | | | Anneal at 325°C For 30 min. |
|---|---|---|---|---|
| | 0 | 1 × 10¹³ | 7.9 × 10¹³ | |
| 1 | 58 | 71 | 230 | 100 |
| 2 | 51 | 60 | 160 | 47 |
| 3 | 67 | 84 | 218 | 110 |
| 4 | 52 | 62 | 136 | 85 |
| 5 | 76 | 107 | 355 | 240 |
| 6 | 54 | 60 | 250 | 48 |

Here again the data shows the reduction of the gate sensitivity below a desired value on selective irradiation of gating portions of the device and recovery of the gate sensitivity on annealing.

While presently preferred embodiments have been shown and described with particularity, it is distinctly understood that the invention may be otherwise variously performed within the scope of the following claims.

What is claimed is:

1. A method of decreasing gate sensitivity of a gated semiconductor device without significantly affecting other electrical characteristics of the device comprising the steps of:

a. masking conducting portions of a gated semiconductor device with a first given gate sensitivity against radiation from a radiation source;

b. thereafter decreasing the gate sensitivity to a second gate sensitivity value below a desired value by selectively irradiating gating portions of the semiconductor device with the radiation source; and c. thereafter increasing the gate sensitivity to a third desired gate sensitivity value below said first gate sensitivity value by annealing at least irradiated gating portions of the semiconductor device.

2. A method of decreasing gate sensitivity of a gated semiconductor device as set forth in claim 1 wherein: step (a) involves masking substantially all of the conducting portions while leaving substantially all of the gating portions unmasked.

3. A method of decreasing gate sensitivity of a gated semiconductor device as set forth in claim 1 wherein: step (b) involves irradiating with electron radiation of greater than 1 Mev intensity to a dosage level greater than about $1 \times 10^{13}$ electrons/cm².

4. A method of decreasing gate sensitivity of a gated semiconductor device as set forth in claim 1 wherein: step (c) involves selectively annealing only irradiated gating portions of the semiconductor device.

5. A method of decreasing gate sensitivity of a gated semiconductor device as set forth in claim 4 comprising the additional step of:

d. measuring gate sensitivity while performing step (c).

6. A method of decreasing gate sensitivity of a gated semiconductor device without significantly affecting other electrical characteristics of the device comprising the steps of:

a. masking conducting portions of a gated semiconductor device with a first given gate sensitivity against radiation from an electron radiation source;

b. thereafter decreasing the gate sensitivity to a second gate sensitivity value below a desired value by irradiating gating portions of the semiconductor device with electron radiation of greater than 1 Mev intensity from the electron radiation source; and c. thereafter increasing the gate sensitivity to a third desired gate sensitivity value below said first gate sensitivity value by annealing at least irradiated gating portions of the semiconductor device.

7. A method of decreasing gate sensitivity of a gated semiconductor device as set forth in claim 6 wherein: step (b) involves irradiating to a dosage between $1 \times 10^{13}$ and $1 \times 10^{15}$ electrons/cm².

8. A method of decreasing gate sensitivity of a gated semiconductor device as set forth in claim 7 wherein: step (b) involves irradiating to a dosage between $1 \times 10^{14}$ and $5 \times 10^{14}$ electrons/cm².

9. A method of decreasing gate sensitivity of a gated semiconductor device as set forth in claim 6 wherein: step (c) involves selectively annealing only irradiated gating portions of the semiconductor device.

* * * * *